United States Patent
Fujita

(10) Patent No.: US 8,878,075 B2
(45) Date of Patent: Nov. 4, 2014

(54) CONNECTING STRUCTURE AND A DISPLAY DEVICE WITH SAID CONNECTING STRUCTURE

(75) Inventor: Akira Fujita, Kawasaki (JP)

(73) Assignee: NLT Technologies, Ltd., Kanagawa (JP)

( * ) Notice: Subject to any disclaimer, the term of this patent is extended or adjusted under 35 U.S.C. 154(b) by 199 days.

(21) Appl. No.: 13/472,135

(22) Filed: May 15, 2012

(65) Prior Publication Data

US 2012/0292105 A1  Nov. 22, 2012

(30) Foreign Application Priority Data

May 16, 2011  (JP) .................. 2011-109367

(51) Int. Cl.

| H05K 1/11 | (2006.01) |
|---|---|
| H05K 1/00 | (2006.01) |
| H05K 1/03 | (2006.01) |
| H05K 1/09 | (2006.01) |
| H05K 1/02 | (2006.01) |
| H05K 3/32 | (2006.01) |

(52) U.S. Cl.
CPC ........ *G06F 1/13338* (2013.01); *G02F 2201/50* (2013.01); *H05K 2201/10128* (2013.01); *H05K 3/321* (2013.01)
USPC ........... 174/261; 174/250; 174/255; 174/256; 174/257; 174/259

(58) Field of Classification Search
CPC ......... H05K 3/323; H01R 4/70; H02G 15/003
USPC ....... 174/84 R, 250, 255, 259, 260, 261, 256; 257/787–796
See application file for complete search history.

(56) References Cited

U.S. PATENT DOCUMENTS

| 5,155,301 | A   | * | 10/1992 | Mase ........................ 174/88 R |
|---|---|---|---|---|
| 6,429,382 | B1  | * | 8/2002  | Amami et al. ............... 174/259 |
| 6,495,758 | B2  | * | 12/2002 | Saitoh ........................ 174/94 R |
| 6,734,567 | B2  | * | 5/2004  | Chiu et al. .................... 257/778 |
| 2002/0149298 | A1 | * | 10/2002 | Furukawa et al. ............ 310/340 |
| 2006/0078715 | A1 | * | 4/2006  | Lu ................................ 428/209 |
| 2008/0305624 | A1 | * | 12/2008 | Lu et al. ....................... 438/612 |
| 2009/0246477 | A1 | * | 10/2009 | Lin et al. ...................... 428/189 |
| 2010/0220450 | A1 | * | 9/2010  | Huang et al. ................. 361/748 |
| 2010/0220454 | A1 | * | 9/2010  | Koga ............................ 361/767 |

FOREIGN PATENT DOCUMENTS

| JP | 2008-299161 A | 12/2008 |
|---|---|---|
| JP | 2009-008971 A | 1/2009 |

* cited by examiner

*Primary Examiner* — Timothy Thompson
*Assistant Examiner* — Sherman Ng
(74) *Attorney, Agent, or Firm* — Sughrue Mion, PLLC

(57) ABSTRACT

Providing a connecting structure for connecting first electrodes formed on the upper surface of a first substrate to second electrodes formed on the upper surface of a second substrate glued on the upper surface of the first substrate by an electrically conductive member, wherein the second substrate is smaller in its outer size than the first substrate, the first electrodes are arranged on the first substrate around the periphery of the second substrate, a gap is formed between the first and second substrates at the peripheral edge of the second substrate, an insulating resin is arranged near the first electrodes so as to cover portions of the side surfaces of the second substrate and to fill the gap between the first and second substrates, and the electrically conductive member is arranged over regions leading from the first electrodes through the insulating resin to the second electrodes.

5 Claims, 10 Drawing Sheets

CONNECTING STRUCTURE AND A DISPLAY DEVICE WITH SAID CONNECTING STRUCTURE

TECHNICAL FIELD

This invention relates to a connecting structure and a display device with said connecting structure, and more particularly to a transfer connecting structure for connecting electrodes provided on upper and lower substrates with use of an electrically conductive member and a display device with said transfer connecting structure.

BACKGROUND OF THE INVENTION

A liquid crystal display device being one of display devices is recently often utilized as a displaying instrument given with a touch panel function and thus an in-cell touch panel formed integrally with the touch panel function during a manufacturing step of an LCD (Liquid Crystal Device) or an on-cell touch panel progressively develops. In the on-cell touch panel, particularly the on-cell touch panel of a capacitance system of a surface capacitive type, the transfer connecting structure for connecting electrodes provided on upper and lower substrates with use of the electrically conductive member is adopted.

In the above transfer connecting structure, concretely, a transparent electrically conductive film layer such as an ITO (Indium Tin Oxide), etc. is uniformly applied on the back (the plane not opposed (faced) to the TFT (Thin Film Transistor) substrate) of a CF (Color Filter) substrate, signal detecting electrodes for detecting the change of capacitance at a touch are provided at the 4 corners of the back of the CF substrate with use of the electrically conductive member such as an Ag paste, etc. and said signal detecting electrodes are connected to terminal electrodes provided on the TFT substrate with use of an electrically conductive member having a viscosity. This transfer connecting structure is noted in a point that it can be relatively easily realized without a substantial change of the construction of conventional LCD panels, and thus the various techniques with respect to the transfer connecting structure have been proposed.

For example, the following patent document 1 (JP2008-299161A) discloses an electro-optic device comprising a first substrate, a second substrate opposed to said first substrate, an electro-optic material sandwiched between said first and second substrates, a common electrode and pixel electrodes formed on the surface of said first substrate, which surface is positioned at the side of said electro-optic material, an earth terminal formed on the surface of the protruded region of said first substrate which is protruded out of one side edge of said second substrate, which surface is positioned at the side of said second substrate, an electrically conductive layer formed on a plane of said second substrate, which plane is positioned at the opposite side of said electro-optic material, a conductive portion for electrically connecting at least a part of an end portion of said electrically conductive layer at said side edge of said second substrate to said earth terminal, an optical element formed on said electrically conductive layer on said second substrate with the exception of at least said conductive portion, and a cover member covering at least a portion of a region extending from said protruded region of said first substrate to a region of said second substrate on which said electrically conductive layer is formed, wherein said cover member has an opening in a region overlapping said earth terminal and said conductive portion, and said earth terminal and said conductive portion are connected through the electrically conductive member. Further, the following patent document 2 (JP2009-008971A) discloses a similar electro-optic device.

SUMMARY OF THE INVENTION

Problems to be Solved by the Invention

In the conventional transfer connecting structure descried above, as shown in FIG. 10, a first substrate and second substrate are glued to each other, and the electrode (earth terminal) provided on the protruded portion of the first substrate and the electrically conductive layer on the second substrate (CF substrate) are connected to each other with use of the electrically conductive member, but in such construction, there is a significant problem.

A first problem is that the transfer connecting structures of the patent documents 1 and 2 are restricted to the devices such as so-called IPS (In Plane Switching) system (lateral electric field system) wherein the common electrode is not present. That is, in an liquid crystal device of TN (Twisted Nematic) system (vertical electric field system), the liquid crystal is driven by applying a voltage between the upper and lower substrates, it is necessary to provide a common transparent electrode consisting of ITO etc. on the surface of the CF substrate, which surface is opposed to the TFT substrate. Therefore, the electrically conductive member being used for the transfer connecting may penetrate into a gap between the CF substrate and the TFT substrate and thus a short circuit failure may easily be caused between the common transparent electrode provided on the CF substrate and the electrically conductive member as shown in FIG. 8.

A second problem is that depending on the material property of the electrically conductive member used in the transfer connecting structure, a crack may be generated in this electrically conductive member at a step portion (a portion having a difference in level) between the CF substrate and the TFT substrate to lead to a conduction failure. That is, when the electrically conductive member is applied as shown in FIG. 9 (a), depending on the material property (viscosity and thixotropy) of the electrically conductive member, this electrically conductive member could not completely wet and spread at the step portion between the CF substrate and the TFT substrate and thus air bubbles may be entrained. These bubbles are the air confined in the electrically conductive member, which air expands at a cure response process (for example, heating at a firing step) of the electrically conductive member. Thus, as shown in Figure (b), the trapped air gets out of the surface of the electrically conductive member, so that the crack is generated at the transfer connecting portion as shown in FIG. 9 (c).

The present invention has been made in consideration of the above problems and its main object is to provide a high-reliability connecting structure and a display device with said connecting structure, in which connecting structure, a transfer connecting between electrodes can be attained with use of the electrically conductive member and without causing a short circuit failure between these electrodes, and further a conduction failure due to cracks of the electrically conductive member can be obviated.

Means for Solving the Problem

In order to attain the above object, the present invention provide a connecting structure for connecting first electrodes formed on the upper surface of a first substrate to second electrodes formed on the upper surface of a second substrate glued on the upper surface of said first substrate by an electrically conductive member, characterized in that said second substrate is smaller in its outer size than said first substrate, said first electrodes are arranged around the periphery of the second substrate on said first substrate, a gap is formed between said first substrate and said second substrate at the peripheral edge of said second substrate, an insulating resin is arranged near said first electrodes so as to cover portions of the side surfaces of said second substrate and to fill the gap between said first substrate and said second substrate, and said electrically conductive member arranged over regions leading from said first electrodes through the upper surface of the insulating resin to said second electrodes.

Effect of the Invention

According to the connecting structure of the invention and the display device with this connecting structure, at the time of the transfer connecting, the insulating resin is arranged at the side part of the step portion of the upper and lower substrates glued to each other and at the gap portions between the upper and lower substrates, so that it can prevent the electrically conductive member from being penetrated into the gap portions between the upper and lower substrates, and thereby the insulation from the electrode, which does not require a connection, can be attained so as to be able to obviate the short circuit failure. Therefore, it can obviate a risk of the transfer conduction failure due to the cracks of the electrically conductive member which may easily be generated at the step portion when the electrically conductive member is cured.

In addition, according to the connecting structure of the invention and the display device with this connecting structure, the step portion of the upper and lower substrates glued to each other becomes a forward tapered shape in accordance with the arranged insulating resin, so that the electrically conductive member may easily wet and spread along the surface of the insulating resin so as to inhibit an air bubble entrainment,

BRIEF DESCRIPTIONS OF THE DRAWINGS

Figure 9:
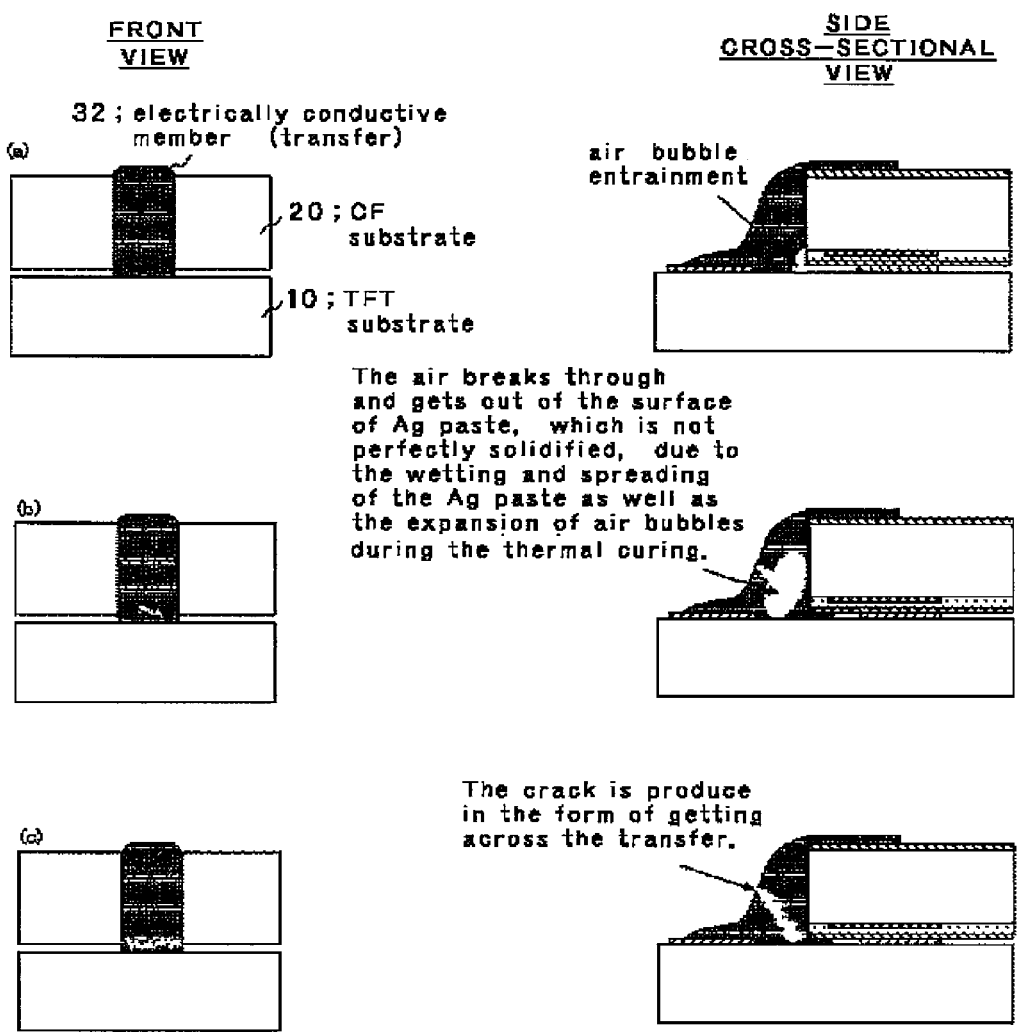
Figure 10:
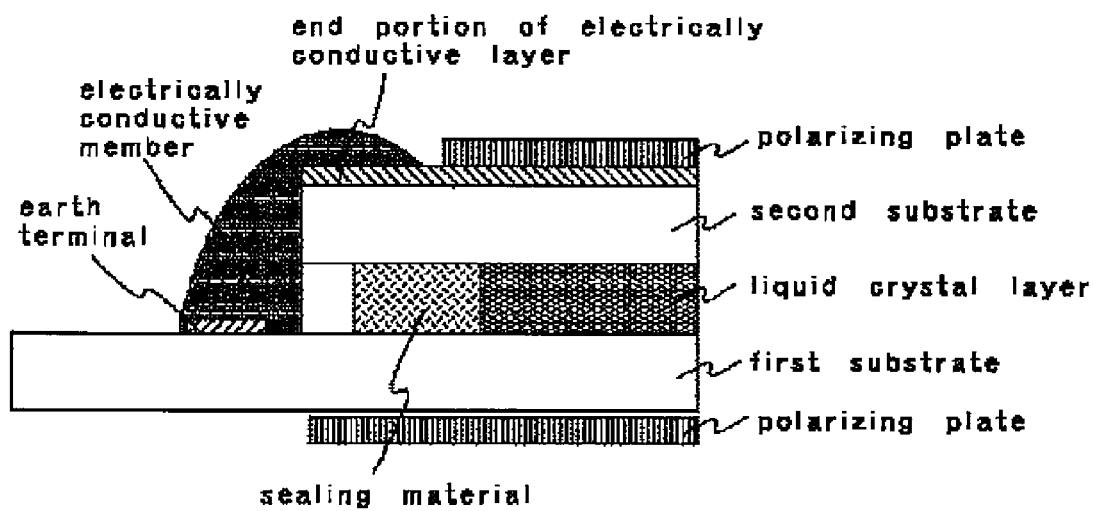

FIG. 9 is front views and side cross-sectional views for explaining a crack generating mechanism in the construction of the transfer connecting portion of the liquid crystal display device according to a prior art; and FIG. 10 is a cross-sectional view diagrammatically showing the construction of the transfer connecting portion of the liquid crystal display device according to a prior art (JP2008-299161A).

DETAILED DESCRIPTIONS OF THE PREFERRED EMBODIMENTS

As explained in the section of "BACKGROUND OF THE INVENTION", in the on-cell touch panel, particularly in the on-cell touch panel of a capacitance system of a surface capacitive type, the transfer connecting structure is adopted, but in the transfer connecting structure, the electrodes are connected to each other with use of the electrically conductive member having a viscosity, so that in the step portion between the CF substrate and the TFT substrate, the electrically conductive member would penetrate into the gap portions between the upper and lower substrates. As the result, there is such a problem that the short circuit failure of the electrode (for example, the common transparent electrode on the surface of the CF substrate, which surface is opposed to the TFT substrate), which does not require a connection, would be caused, and the transfer conduction failure due to cracks at the time of curing the electrically conductive member would be caused.

Therefore, in one aspect of the invention, in portions of the electrically conductive member forming the transfer connecting structure, the insulating resin is arranged at least at the side part of the step portion of the upper and lower substrates and at the gap portions between the upper and lower substrates. Thereby, at least a part of the gap portions between the upper and lower substrates is sealed, so that the short circuit of the electrode (for example, the electrode formed on the opposed surfaces of the upper and lower substrates), which does not require a connection to the electrically conductive member, can be obviated. Further, the short circuit of said electrode can be more definitely obviated by removing the portions of said electrode at the end of the substrate near the transfer connecting structure, or by selecting electrically conductive particles included in the electrically conductive member, which are larger than the gap portions.

The insulating resin is such arranged that the step portion between the upper and lower substrates becomes the forward tapered shape. Thereby, the electrically conductive member to be arranged thereafter may easily spread and is arranged across the insulating resin, so that an air bubble entrainment may be inhibited so as to avoid the transfer conduction failure due to cracks which may be generated when the electrically conductive member is cured.

Hereinafter, the invention will be explained in detail with reference to accompanying drawings. In the following embodiments, the liquid crystal display device of the TN system (vertical electric field system) will be explained as the examples of the display device of the invention, but the invention should not be restricted to the driving systems such as the TN and IPS systems and may also similarly be applied to a plasma display, an organic EL display, an electronic paper display, etc.

Embodiment 1

Figure 1:
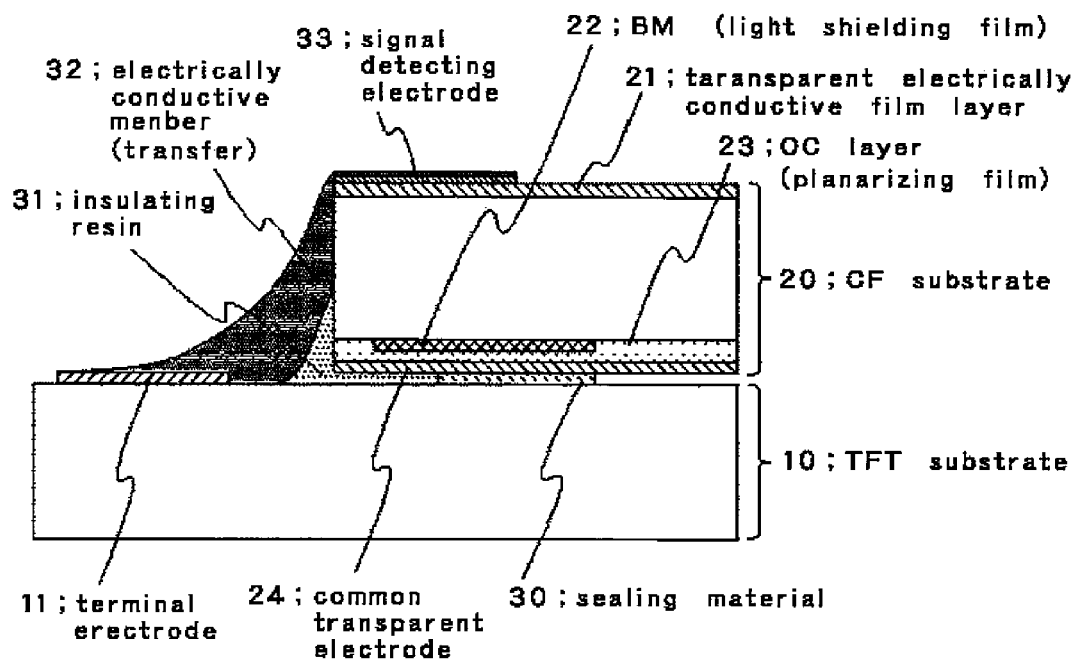
FIG. 1 is a cross-sectional view diagrammatically showing the structure of the transfer connecting portion of the liquid crystal display device according to a first embodiment of the present invention.

The invention of the present application will now be explained in more detail with respect to the embodiments. A connecting structure of a first embodiment of the invention and a display device with use of said connecting structure will be explained with reference to FIGS. 1 and 2. FIG. 1 is a cross-sectional view diagrammatically showing a structure of a transfer connecting portion of a liquid crystal display device according to this embodiment and FIGS. 2 (*a*)-(*d*) are plane and cross-sectional views diagrammatically showing a transfer connecting method of the liquid crystal display device according to this embodiment.

A display panel for forming the liquid crystal display device according to this embodiment is a liquid crystal display panel comprising an on-cell touch panel function. In this liquid crystal display panel, as in a usual liquid crystal display panel of a TN driving system, a thin-film transistor substrate (hereinafter referred to as a TFT substrate) wherein pixel electrodes are formed on each of pixels, and a color filter substrate (hereinafter referred to as a CF substrate) wherein a color layer is assigned to each of the pixels and a common transparent electrode is formed on the whole surface, are glued through a liquid crystal layer to each other with use of a sealing material.

In this case, the upper and lower substrates forming the liquid crystal display panel are not restricted to said TFT and CF substrates. These substrates are only necessary to have such construction that one of the substrates is larger in its size than the other, a step portion is obtained between the upper and lower substrates when these substrates are glued to each other, the electrodes formed on one substrate may be three-dimensionally-connected across said step portion to those formed on the other substrate in electrically-conductive manner, and in addition an electrically-conductive layer corresponding to the common transparent electrode may be formed between the opposed surfaces of the upper and lower substrates.

In this embodiment, in order to provide the on-cell touch panel function of a capacitance system of a surface capacitive type, as shown in FIG. 1, a transparent electrically conductive film layer 21 (for example, an electrically conductive film having a sheet resistance of almost a few kilo-ohms/square) is uniformly formed on the back (the plane not opposed to the TFT substrate 10) of the CF substrate 20. Further, the common transparent electrode 24 is uniformly formed on the surface (the plane opposed to the TFT substrate 10) of the CF substrate 20. The transparent electrically conductive film layer 21 on the back of the CF substrate 20 may also be coated during the manufacturing step of the CF substrate 20, or for example, after the display device has been separated as a panel of the upper and lower substrates glued to each other, said transparent electrically conductive film layer 21 may be formed by applying the electrically conductive film, etc.

On the other hand, the TFT substrate 10 is larger in its size than the CF substrate 20, so that a portion of the TFT substrate 10 is exposed when this TFT substrate is glued to the CF substrate 20, and terminal electrodes 11 for the transfer connecting are formed on the exposed portion of the surface (the plane opposed to the CF substrate 20) of the TFT substrate 10. Further, it is not shown in FIG. 1, but on the surface of the TFT substrate 10 is formed a signal wiring for transferring a detected signal to a circuit substrate through the terminal electrodes 11 and an external connection terminal electrode.

The CF substrate 20 is glued to the CF substrate 20 to form the liquid crystal display panel. To this liquid crystal display panel, in addition to the transfer connecting structure to be hereinafter described, polarizing plates (not shown) are applied at the outer sides of the two substrates; a driving IC, a signal substrate (not shown), etc. are connected; a back-lighting is set-in; and a front chassis plate, etc. is provided to accomplish the liquid crystal display device with the on-cell touch panel function.

Figure 2:
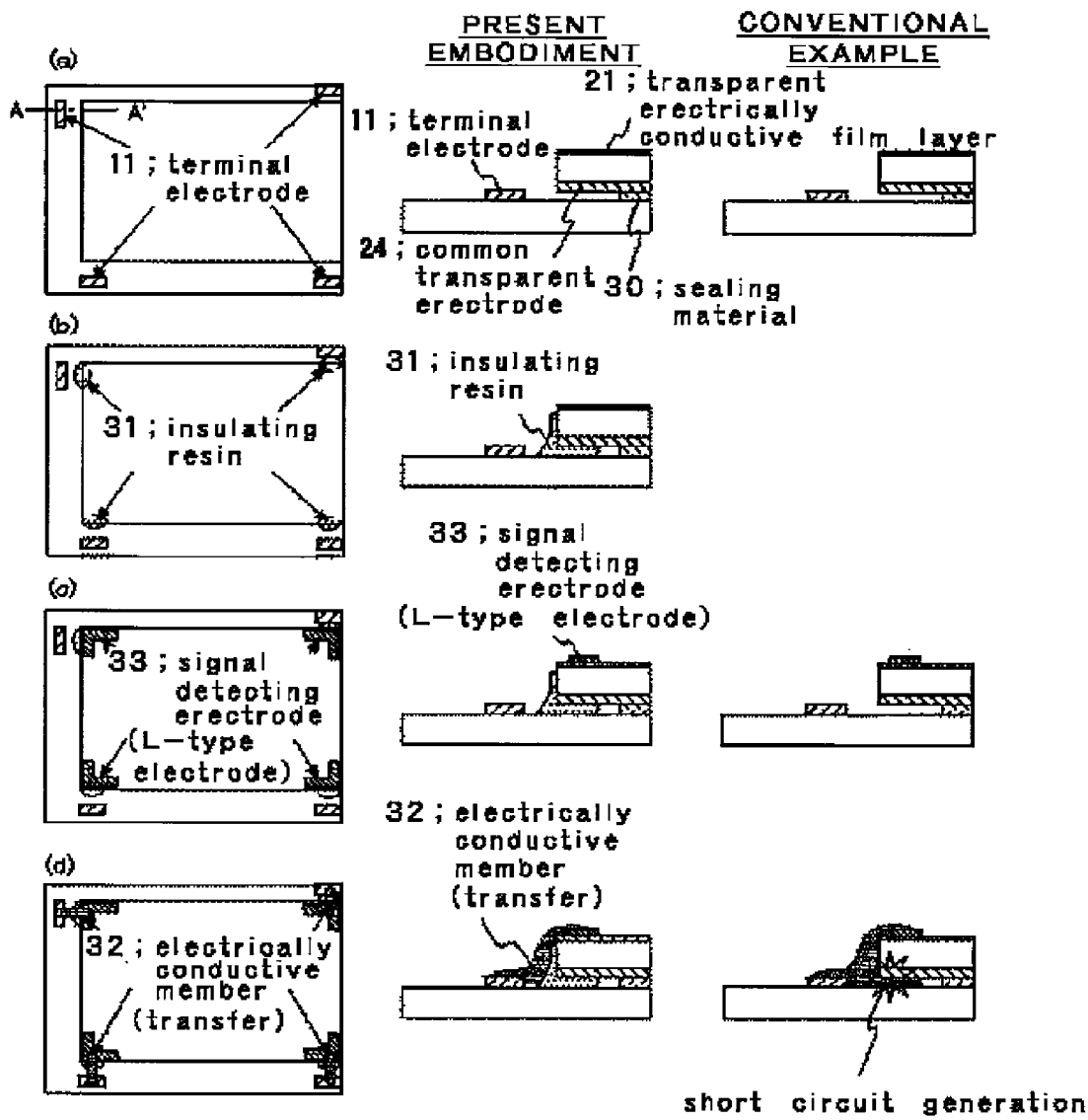
FIG. 2 is plane and cross-sectional views diagrammatically showing a transfer connecting method in the liquid crystal display device according to the first embodiment of the present invention.

A transfer connecting method in the liquid crystal display panel according to this embodiment is now explained with reference to FIG. 2. The left-hand portions in FIG. 2 are plane views of the liquid crystal display panel viewed from its upper side (the side of the CF substrate 20), the middle portions are cross-sectional views along a line A-A' (shown only in FIG. 2 (*a*)) in these plane views. Further, the right-hand portions in FIG. 2 are cross-sectional views showing a conventional liquid crystal display panel.

First, with use of a publicly-known method, the TFT substrate 10 and the CF substrate 20 are provided. A method of manufacturing the TFT substrate 10 and the CF substrate 20 should not be restricted to a specific method, but the TFT substrate 10 is, for example, manufactured such that on a transparent electrical insulating substrate such as glass, gate wires are arranged in a parallel manner, TFTs are provided at positions corresponding to each of pixels, and drain wires are arranged in a parallel manner in a direction perpendicular to the gate wires. Further, pixel electrodes are formed on each of pixels and terminal electrodes 11 are formed at arbitrary positions (at 4 corners in this embodiment) on the circumference of the substrate. Moreover, the CF substrate 20 is, for example, manufactured such that on a transparent electrical insulating substrate such as glass which is smaller in its size than the TFT substrate 10 and which does not overlap the terminal electrodes, are provided with color layers having three primary colors of red (R), green (G) and blue (B) at positions opposed to each of the pixels on the TFT substrate 10; BM films (light shielding films) 22 are provided for shielding excess lights; and the whole surface of the transparent electrical insulating substrate is covered with an OC layer (planarizing film) 23, on which the common transparent electrode 24 is formed. Further, the transparent electrically conductive film layer 21 is formed on the plane of the substrate, which plane is positioned at the opposite side of the common transparent electrode 24.

Next, the sealing material 30 in the form of flame, which is slightly smaller in its size than the outer shape of the CF substrate 20, is applied to one of the substrates. Then, these substrates are glued to each other and thereafter the liquid crystal is injected into a gap between the upper and lower substrates through a liquid crystal pouring hole. Alternatively, the liquid crystal is dropped onto the substrate, to which the sealing material 30 was applied, and then the other substrate is attached to the former substrate. In this manner, the liquid crystal panel, as shown in FIG. 2 (*a*), is in a state that a gap is formed between the portion of the CF substrate 20 which is located outside of the sealing material 30 and the TFT substrate 10, and in this gap the common transparent electrode 24 of the CF substrate 20 is exposed.

Next, in the above liquid crystal panel, the terminal electrodes 11 of the TFT substrate 10 are transfer-connected to the transparent electrically conductive film layer 21 of the CF substrate 20. In this case, in order for an electrically conductive member 32 described below not to penetrate into the gap portions between the upper and lower substrates, in this embodiment, an insulating resin 31 having a viscosity is applied as shown in FIG. 2 (*b*). The places, at which the insulating resin 31 is applied, should be near the places at which signal detecting electrodes 33 are transfer-connected as described below, and leastwise should be within the gap portions between the CF substrate 20 and the TFT substrate 10 at the 4 corners of the CF substrate 20. This insulating resin 31 seals at least the outsides of said gap portions (the ends of the CF substrate 20) and thereby the side portions become a forward tapered shape.

In this embodiment, the insulating resin 31 is applied at the 4 corners of the CF substrate 20, but may be applied to the whole of the circumference of the CF substrate 20. Further, this insulating resin 31 is, for example, a silicone resin, an acrylic resin, etc. but may be a thermosetting resin, a cold setting resin, a UV setting resin, etc. provided that a required insulating level (which is not less than a few M ohms) may be maintained. Moreover, as a method of applying the insulating resin 31, a dispenser application, an inkjet application, a drop filling method (i.e., a method of penetrating a resin into gap portions with use of a capillarity), etc. may be used.

After curing of the insulating resin 31, in order to provide the touch panel function, the signal detecting electrodes 33 having a given shape (in this case an L-type) are formed at the 4 corners on the transparent electrically conductive film layer 21 on the back (the plane not opposed to the TFT substrate 10) of the CF substrate 20 as shown in FIG. 2 (c). These signal detecting electrodes 33 may be formed by applying or printing an electrically conductive member such as Ag paste, etc. Alternatively, these electrodes may also be obtained by clamping connection of Cu foil components previously formed into a given shape, via an electrically conductive tape consisting of an anisotropic electrically conductive film, etc.

Then, as shown in FIG. 2 (d), the signal detecting electrodes 33 on the CF substrate 20 and the terminal electrodes 11 on the TFT substrate 10 are transfer-connected to each other through the side of the CF substrate 20 by the electrically conductive member 32 having a viscosity such as Ag past, etc. In this case, the electrically conductive member 32 should not spread out of the region to which the insulating resin 31 is applied. As this transfer connecting, a dispenser application, an inkjet application, or a printing method (for example, a pad printing method), etc. may be used. Thereafter, the electrically conductive member 32 is cured with use of a heat firing, a UV exposure, etc. in accordance with the material property of this electrically conductive member 32 so as to obtain a desired transfer connecting structure.

As described above, in the liquid crystal display panel of this embodiment, the insulating resin 31 is arranged at the step portion and the gap portions between the upper and lower substrates in the transfer connecting portions, so that the electrically conductive member 32 for connecting the signal detecting electrodes 33 of the CF substrate 20 to the terminal electrodes 11 of the TFT substrate 10 is not penetrated into said gap portions so as to be able to obviate a short circuit failure between the common transparent electrode 24 of the CF substrate 20 and the electrically conductive member 32.

Further, the step portion between the CF substrate 20 and the TFT substrate 10 becomes the forward tapered shape by the insulating resin 31, so that the electrically conductive member 32 wets and spreads along the surface of the insulating resin 31 so as to inhibit an air bubble entrainment. Therefore, it can obviate a risk of the transfer conduction failure due to cracks which may be generated when the electrically conductive member 32 is cured.

Embodiment 2

Figure 3:
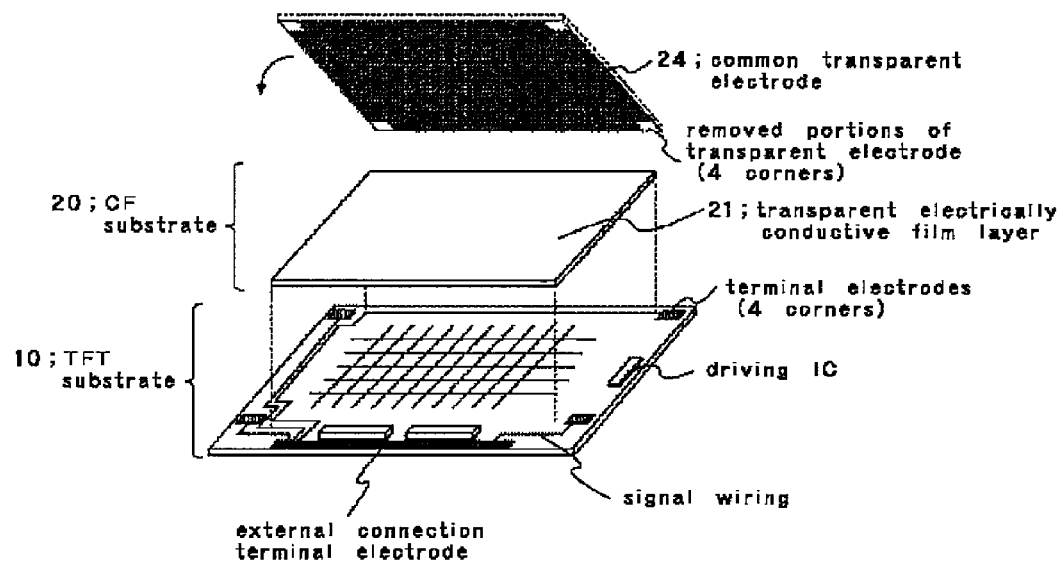
FIG. 3 is a perspective view diagrammatically showing the structure of the liquid crystal display device according to a second embodiment of the present invention.

Next, a connecting structure according to a second embodiment of the present invention and a display device with said connecting structure will be explained with reference to FIGS. 3 and 4. FIG. 3 is a perspective view diagrammatically showing the structure of the display device according to this embodiment and FIG. 4 is a cross-sectional view diagrammatically showing the structure of the transfer connecting portion of the display device according to this embodiment.

In the first embodiment described above, the common transparent electrode 24 is formed on the whole of the surface (the plane opposed to the TFT substrate 10) of the CF substrate 20, so that if the quantity for application of the insulating resin 31 is low, the common transparent electrode 24 may become partially exposed to contact with the electrically conductive member 32. Also, if the width of the region to which the electrically conductive member 32 is applied is wider than the insulating resin 31, then the portions of the common transparent electrode 24 which are not covered with the insulating resin 31 may contact with the electrically conductive member 32.

Figure 4:
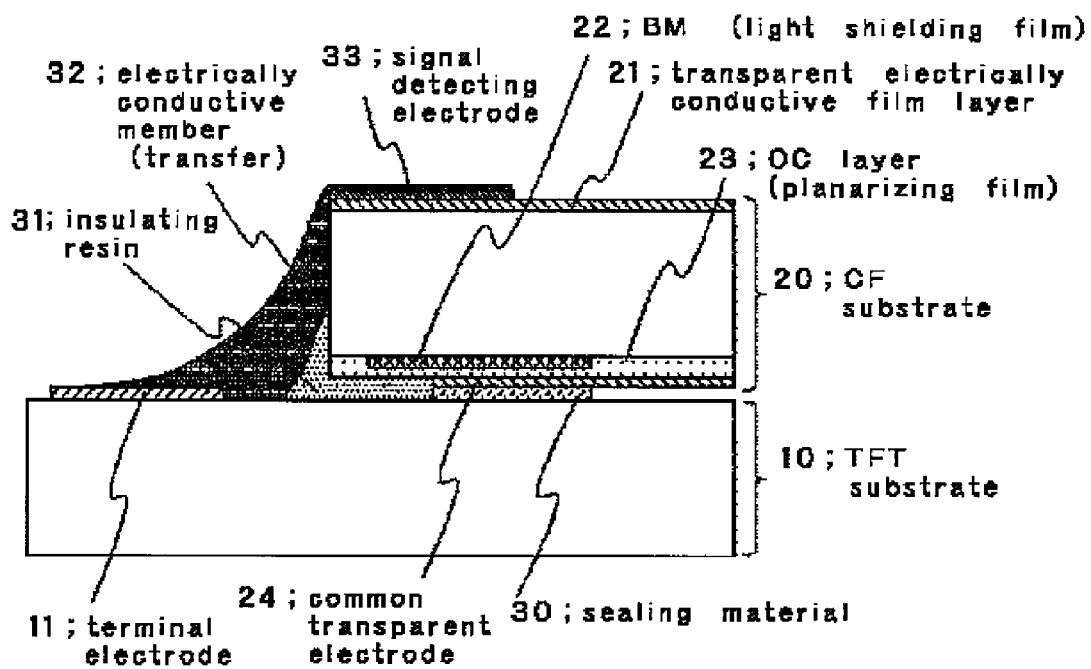
FIG. 4 is a cross-sectional view diagrammatically showing the structure of the transfer connecting portion of the liquid crystal display device according to the second embodiment of the present invention.

Therefore, in the second embodiment, in order to reduce the risk of the common transparent electrode 24 being in contact with the electrically conductive member 32, the common transparent electrode 24 is constructed such that the 4 corner regions of this common transparent electrode 24 for transfer-connecting are previously removed at the surface (the plane opposed to the TFT substrate 10) of the CF substrate 20 as shown in FIGS. 3 and 4.

As a method of removing the 4 corner regions of the common transparent electrode 24, ITO film, etc. being the common transparent electrode 24 may not be formed at these 4 corner regions in sputtering with use of metal mask, or after ITO film, etc. being the common transparent electrode 24 is deposited over the whole surface by sputtering, the 4 corner regions of the ITO film, etc. may be removed by etching. Alternatively, instead of removing the 4 corner regions of the common transparent electrode 24, insulating films may be formed on the 4 corner regions of the common transparent electrode 24.

It should be noted that the shape of the regions from which the portions of the common transparent electrode 24 are removed is not restricted to the rectangular shape as shown in FIG. 3. For example, the common transparent electrode 24 may be removed from the belt-like peripheral portion of the CF substrate 20. The removing distance of the common transparent electrode 24 from the end of the CF substrate 20 may be arbitrarily determined, but it is preferably taken into account that if the removed portion of the common transparent electrode 24 overlaps with the applied region of the sealing material 30, the sealing efficiency may be reduced.

In this manner, in the second embodiment, it is apparent from the cross-sectional view of FIG. 4 that the common transparent electrode 24 backs away from the end of the CF substrate 20, so that the insulation level can be enhanced so as more definitely to obviate the short circuit failure between the electrically conductive member 32 and the common transparent electrode 24 with a high yield, and thus the insulation effect in the first embodiment can be more improved.

Embodiment 3

Figure 5:
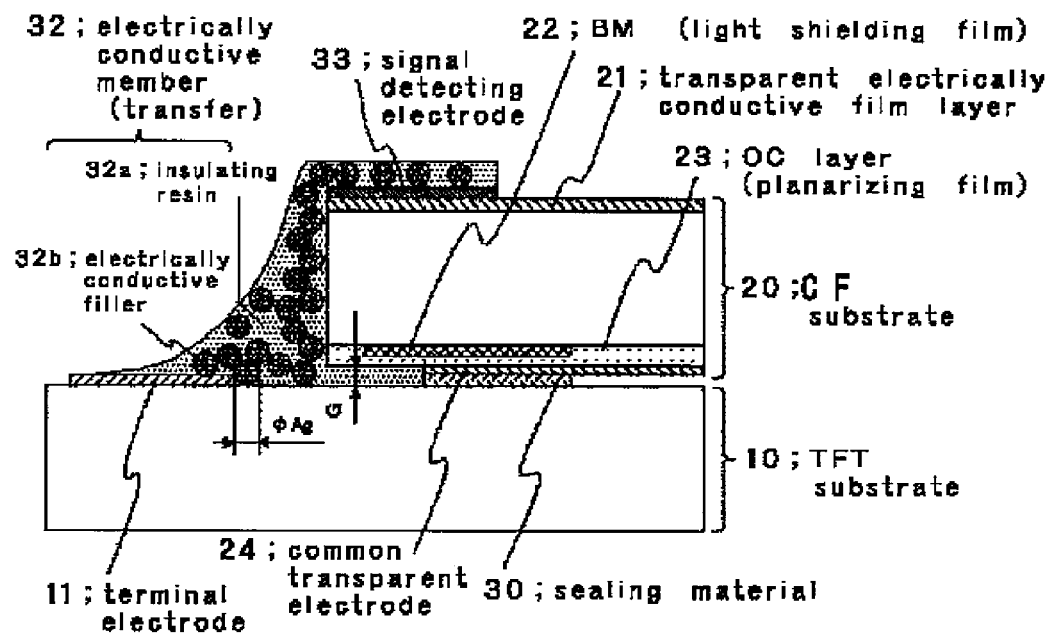
FIG. 5 is a cross-sectional view diagrammatically showing the construction of the transfer connecting portion of the liquid crystal display device according to a third embodiment of the present invention.

Next, a connecting structure according to a third embodiment of the present invention and a display device with said connecting structure will be explained with reference to FIG. 5. FIG. 5 is a cross-sectional view diagrammatically showing the structure of the transfer connecting portion of the display device according to this embodiment.

In the first and second embodiments described above, the method of applying the electrically conductive member 32 after the application of the insulating resin 31 has been used, but in this method, the insulating resin 31 must be cured by heating or UV irradiation before applying the electrically conductive member 32. Further, if the application of the insulating resin 31 is insufficient, the common transparent electrode 24 may be exposed.

Therefore, in the third embodiment, the application is not divided into two steps as the application of the insulating resin 31 and the application of the electrically conductive member 32, and instead only the electrically conductive member 32 is applied to be able to obtain a construction similar to the construction of the second embodiment.

This embodiment will now be concretely explained. As shown in FIG. 5, the Ag paste as an example of the electrically conductive member 32 consists of an insulating resin 32a mixed with Ag powder (exaggeratingly shown in FIG. 5 for being easy to understand) of about 30-95% as an electrically conductive filler 32b. In this case, the particle size (shown in the FIG. 5 by "φ Ag") of the Ag powder contained in the insulating resin 32a is larger than the size (shown in the FIG. 5 by "G") of the gap between the CF substrate 20 and the TFT substrate 10 (i.e., the relation of φ Ag>G is satisfied), so that the Ag powder could not penetrate into the gap portions so as to prevent the short circuit between the electrically conductive member 32 and the common transparent electrode 24.

Then, the viscosity of the insulating resin 32a, into which the Ag powder is dispersed, is set to such a value that the insulating resin 32a may be penetrated into the gap between the CF substrate 20 and the TFT substrate 10, so that only the insulating resin 32a may be penetrated into the gap portions. Thereby, in the step of the transfer connecting of the electrically conductive member 32, the insulation from the common transparent electrode 24 and the electrode connection between the upper and lower substrates can be simultaneously attained.

In FIG. 5, as with the case of the second embodiment, the common transparent electrode 24 backs away from the end of the CF substrate 20, but the electrically conductive member 32 of the third embodiment may also be applied to the construction of the first embodiment shown in FIG. 1. In this case, there is a possibility that the end of the common transparent electrode 24 contacts with the electrically conductive filler 32b, but the contact area is of much smaller than that in the prior art construction, so that the insulation of the electrically conductive member 32 from the common transparent electrode 24 can be more improved than the prior art.

In this manner, in this third embodiment, it is apparent that in the transfer connecting construction, the electrically conductive member (the electrically conductive filler 32b) could not enter into the gap between the CF substrate 20 and the TFT substrate 10, so that as with the case of the second embodiment, the insulation level can be enhanced so as more definitely to obviate the short circuit failure between the electrically conductive member 32 and the common transparent electrode 24 with a high yield. Further, in this third embodiment, the insulating resin 31 needs not to be applied and cured before applying the electrically conductive member 32, so that the time required to the transfer connecting can be more reduced than the second embodiment.

Figure 6:
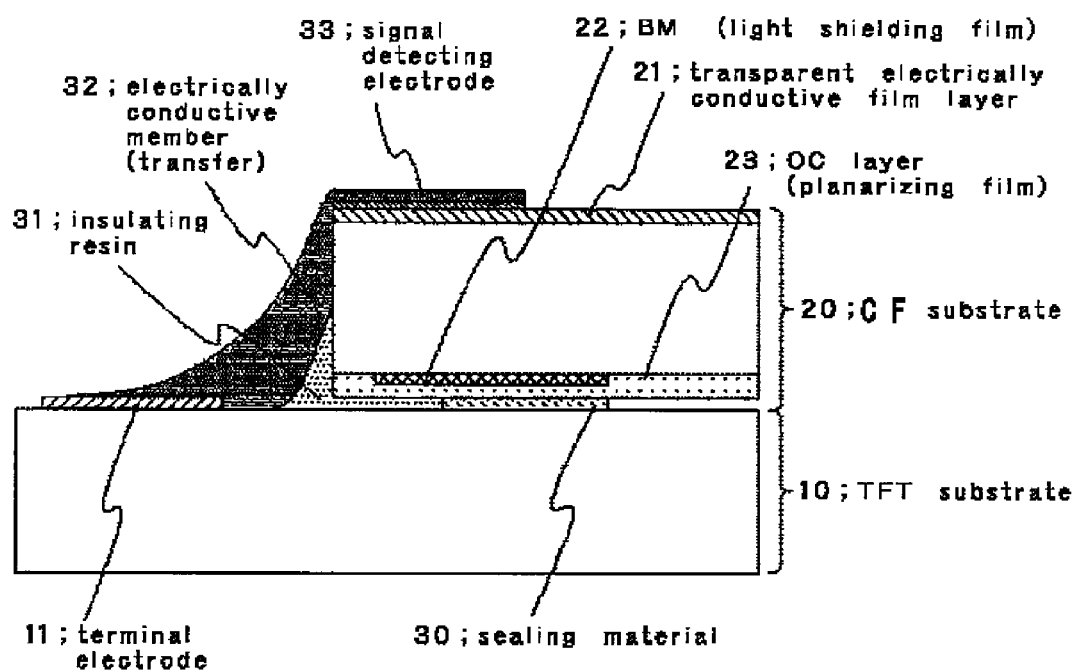
FIG. 6 is a cross-sectional view diagrammatically showing another construction of the transfer connecting portion of the liquid crystal display device according to the present invention.
Figure 7:
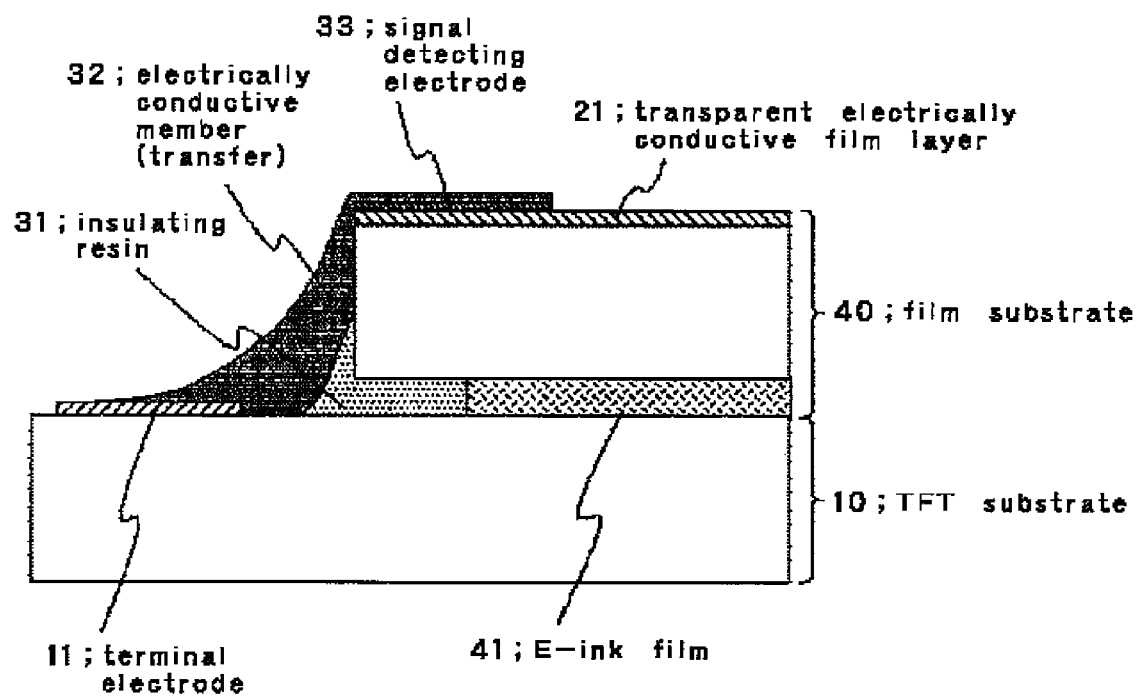
FIG. 7 is a cross-sectional view diagrammatically showing the construction of the transfer connecting portion of the electronic paper display according to the present invention.
Figure 8:
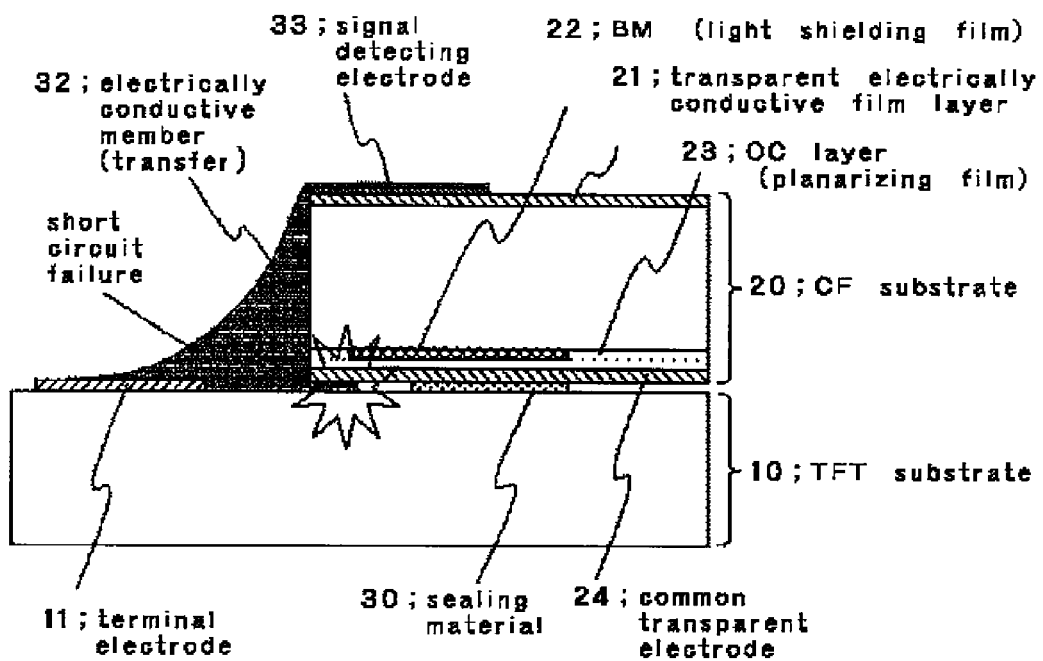
FIG. 8 is a cross-sectional view diagrammatically showing the construction of the transfer connecting portion of the liquid crystal display device according to a prior art and its problematic point.

It should be noted that the present invention is not restricted to the above embodiments and its construction can be accordingly modified without departing from the spirit of the invention. For example, the present invention can be similarly applied to a construction without the OC layer (planarizing film) 23 or a construction wherein the BM films (light shielding films) 22 are formed by metal layers or low resistance resin material. Further, in the above embodiments, the constructions wherein the surface (the plane opposed to the TFT substrate 10) of the CF substrate 20 is provided with the common transparent electrode 24, but the present invention may be also applied to, for example, a construction without the common transparent electrode 24 such as the liquid crystal display panel having IPS construction (see FIG. 6) or the electronic paper display (see FIG. 7). In these constructions, there is no common transparent electrode 24, so that the short circuit failure may not be caused, but the present invention can obtain an effect of avoiding the transfer conduction failure due to cracks which may be generated when the electrically conductive member 32 is cured.

Moreover, in the transfer connecting structure of each embodiment, if necessary, the insulation from a metal plate member etc. at an assembly time of module may be maintained by an insulating protective resin (for example, a silicone resin) not shown which covers at least the electrically conductive member, or by an insulating tape etc.

INDUSTRY APPLICABILITY

The present invention may be applicable to the display device wherein the electrodes provided on the upper and lower substrates are connected to each other with use of the transfer connecting construction, particularly applicable to an in-cell touch panel formed integrally with a touch panel function or an on-cell touch panel.

The invention claimed is:

1. A connecting structure for connecting first electrodes formed on the upper surface of a first substrate to second electrodes formed on the upper surface of a second substrate glued on the upper surface of said first substrate by an electrically conductive member,
   wherein said second substrate is smaller in its outer size than said first substrate, said first electrodes are arranged on said first substrate around the periphery of the second substrate, a gap is formed between said first substrate and said second substrate at the peripheral edge of said second substrate, an insulating resin is arranged near said first electrodes so as to cover portions of the side surfaces of said second substrate and to fill the gap between said first substrate and said second substrate, said electrically conductive member is arranged over regions leading from said first electrodes through the upper surface of the insulating resin to said second electrodes, and the plane of said second substrate, which plane is opposed to said first substrate, is provided with a third electrode at least at the end periphery of said second substrate, and
   wherein the portions of said third electrodes near said first electrodes are removed.

2. The connecting structure according to claim 1, wherein said electrically conductive member consists of said insulating resin into which electrically conductive particles are dispersed, the particle size of said electrically conductive particles is set to a value larger than the gap between said first substrate and said second substrate, and in said gap between said first substrate and said second substrate, said electrically conductive particles of said electrically conductive member are not arranged and only said insulating resin is arranged.

3. The connecting structure according to claim 1, wherein said electrically conductive member is an electrically conductive paste.

4. The connecting structure according to claim 1, wherein said insulating resin arranged so as to fill said gap between said first substrate and said second substrate becomes a forward tapered shape at the upper surface of the first substrate from the side surfaces of said second substrate.

5. A display device comprising said connecting structure according to claim 1.

\* \* \* \* \*